(12) United States Patent
Jin Stone

(10) Patent No.: US 12,218,640 B2
(45) Date of Patent: *Feb. 4, 2025

(54) SUPERCONDUCTING AMPLIFICATION CIRCUIT

(71) Applicant: PsiQuantum Corp., Palo Alto, CA (US)

(72) Inventor: Qiaodan Jin Stone, Sunnyvale, CA (US)

(73) Assignee: PSIQUANTUM CORP., Palo Alto, CA (US)

( * ) Notice: Subject to any disclaimer, the term of this patent is extended or adjusted under 35 U.S.C. 154(b) by 164 days.

This patent is subject to a terminal disclaimer.

(21) Appl. No.: 17/963,097

(22) Filed: Oct. 10, 2022

(65) Prior Publication Data
US 2023/0179159 A1    Jun. 8, 2023

Related U.S. Application Data

(63) Continuation of application No. 17/124,422, filed on Dec. 16, 2020, now Pat. No. 11,469,728, which is a continuation of application No. PCT/US2019/038143, filed on Jun. 20, 2019.

(60) Provisional application No. 62/696,225, filed on Jul. 10, 2018.

(51) Int. Cl.
*H03F 19/00* (2006.01)
*H03F 3/45* (2006.01)

(52) U.S. Cl.
CPC .................................. *H03F 19/00* (2013.01)

(58) Field of Classification Search
CPC ...... H03F 19/00; H03F 3/45475; H10N 60/30
USPC ...................... 330/61 R, 4.5–4.6, 5
See application file for complete search history.

(56) References Cited

U.S. PATENT DOCUMENTS

| | | | |
|---|---|---|---|
| 3,356,960 A * | 12/1967 | Newhouse | H03F 19/00 505/855 |
| 4,132,956 A * | 1/1979 | Russer | H03F 19/00 505/855 |
| 4,271,443 A | 6/1981 | Nother | |
| 5,083,232 A | 1/1992 | Bergsjo et al. | |
| 5,936,458 A | 8/1999 | Rylov | |
| 5,963,088 A | 10/1999 | Czarnul et al. | |
| 6,812,464 B1 | 11/2004 | Sobolewski | |
| 8,680,853 B2 | 3/2014 | Zakosareniko et al. | |

OTHER PUBLICATIONS

PsiQuantum Corp., International Preliminary Report on Patentability, PCT/US2019/038143, Jan. 12, 2021, 10 pgs.
PsiQuantum Corp., International Search Report and Written Opinion, PCT/US19/38143, Feb. 28, 2020, 12 pgs.

\* cited by examiner

*Primary Examiner* — Hieu P Nguyen
(74) *Attorney, Agent, or Firm* — Morgan, Lewis & Bockius LLP

(57) ABSTRACT

The various embodiments described herein include methods, devices, and systems for fabricating and operating superconducting circuitry. In one aspect, an amplification circuit includes: (1) a superconducting component; (2) an amplifier coupled in parallel with the superconducting component such that the superconducting component is in a feedback loop of the amplifier; (3) a voltage source coupled to a first input of the amplifier; (4) one or more resistors coupled to a second input of the amplifier; and (5) an output terminal coupled to an output of the amplifier.

20 Claims, 5 Drawing Sheets

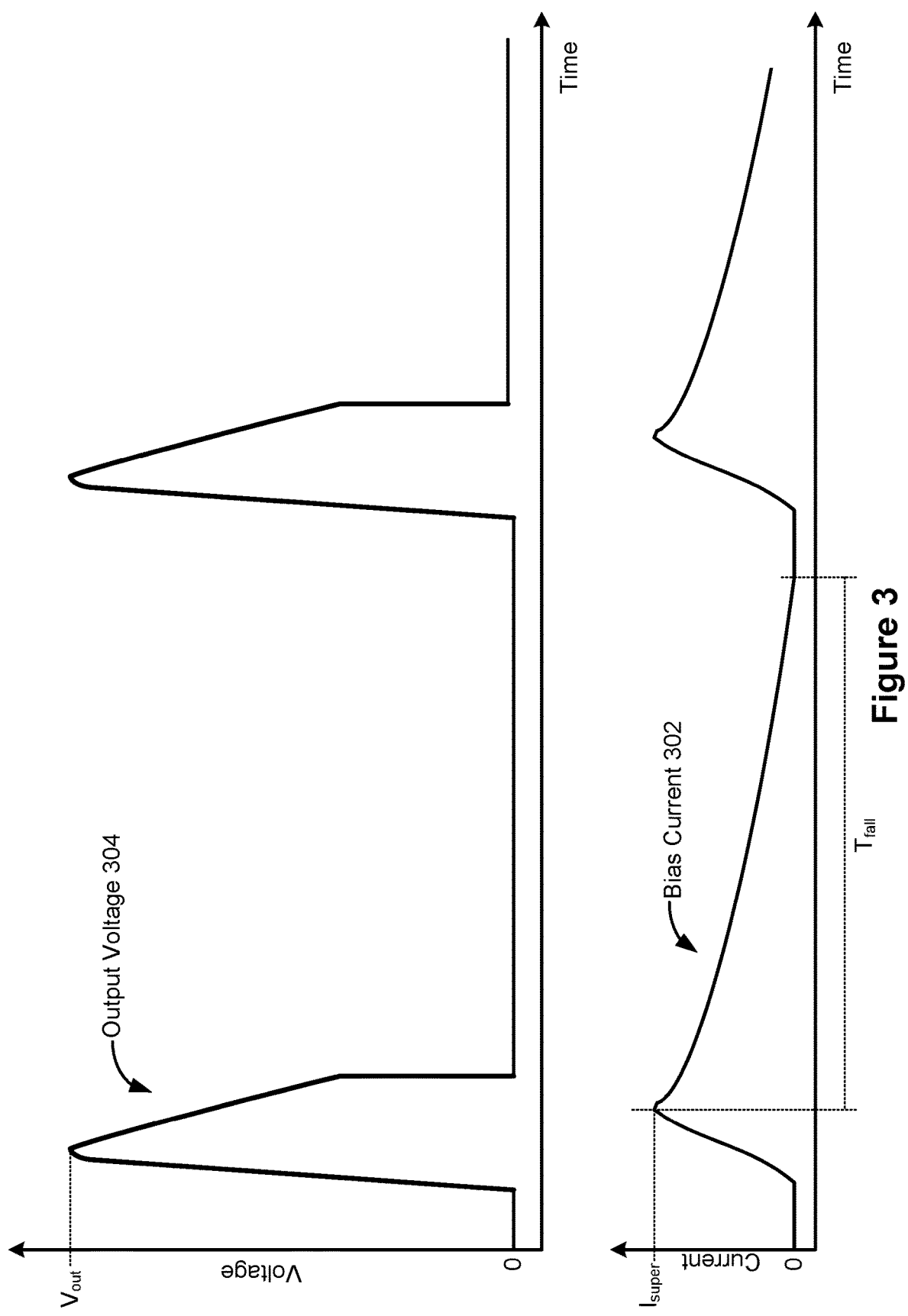

SUPERCONDUCTING AMPLIFICATION CIRCUIT

RELATED AND PRIORITY APPLICATIONS

This application is a continuation of U.S. application Ser. No. 17/124,422, filed Dec. 16, 2020, which is a continuation of PCT International Application No. PCT/US2019/038143, filed on Jun. 20, 2019, which claims priority to U.S. Provisional Application No. 62/696,225, filed on Jul. 10, 2018, each of which is hereby incorporated by reference in its entirety.

TECHNICAL FIELD

This relates generally to signal amplifiers, including but not limited to, superconducting signal amplifiers.

BACKGROUND

Signal amplifiers are widely used in electronic devices, such as audio signal amplifiers, video signal amplifiers, communication signal amplifiers, power amplifiers, etc. Performance of signal amplifiers based on conventional transistors is limited by the operation characteristics of the conventional transistors, such as leakage current, noise, switching speed, and thermal dissipation. Superconductors are materials capable of operating in a superconducting state with zero electrical resistance under particular conditions.

SUMMARY

Accordingly, there is a need for systems and/or devices with more efficient and effective signal amplifiers and methods for operating them. Such systems, devices, and methods for making and/or using them optionally complement or replace conventional systems, devices, and methods for making and/or using thereof.

The amplification circuits described herein utilize the unique property of superconductors to operate in a superconducting state with zero resistance and in a non-superconducting state with non-zero resistance, in accordance with some embodiments. In some embodiments, a transimpedance of the amplification circuit is based on a ratio of a resistance of the superconductor to an input resistance for the amplification circuit. As described below, in some embodiments, an amplification of the amplification circuit is based on an input impedance multiplied by an amplifier voltage gain.

In one aspect, in accordance with some embodiments, an amplification circuit includes: (1) a superconducting component; (2) an amplifier (e.g., a differential amplifier) coupled in parallel with the superconducting component such that the superconducting component is in a feedback loop of the amplifier; (3) a voltage source coupled to a first input (e.g., a positive input) of the amplifier; (4) one or more resistors coupled to a second input (e.g., a negative input) of the amplifier; and (5) an output terminal coupled to an output of the amplifier.

In another aspect, in accordance with some embodiments, an amplification circuit includes a superconducting component coupled in parallel with a resistive component and an inductive component, such that an output voltage of the circuit is an amplification of the current across the superconductor.

In yet another aspect, in accordance with some embodiments, a method for fabrication of a superconducting component includes: (1) depositing a thin film of a superconducting material over a substrate; and (2) removing (e.g., etching) one or more (e.g., two or more) portions of the thin film to define one or more superconducting wires. In some embodiments, the superconducting circuits and components described herein are composed of niobium-germanium adapted to operate in a superconducting state at temperatures above 3 Kelvin (e.g., 3.1 Kelvin to 6 Kelvin).

Thus, devices and systems are provided with methods for fabricating and operating amplification circuits, thereby increasing the effectiveness, efficiency, and user satisfaction with such systems and devices.

BRIEF DESCRIPTION OF THE DRAWINGS

For a better understanding of the various described embodiments, reference should be made to the Detailed Description below, in conjunction with the following drawings in which like reference numerals refer to corresponding parts throughout the figures.

FIG. 3 is a prophetic diagram illustrating voltage output of a superconductor amplification circuit in accordance with some embodiments.

Like reference numerals refer to corresponding parts throughout the several views of the drawings.

DETAILED DESCRIPTION

Reference will now be made in detail to embodiments, examples of which are illustrated in the accompanying drawings. In the following detailed description, numerous specific details are set forth in order to provide a thorough understanding of the various described embodiments. However, it will be apparent to one of ordinary skill in the art that the various described embodiments may be practiced without these specific details. In other instances, well-known methods, procedures, components, circuits, and networks have not been described in detail so as not to unnecessarily obscure aspects of the embodiments.

Many modifications and variations of this disclosure can be made without departing from its spirit and scope, as will be apparent to those skilled in the art. The specific embodiments described herein are offered by way of example only, and the disclosure is to be limited only by the terms of the appended claims, along with the full scope of equivalents to which such claims are entitled.

Figure 1A:
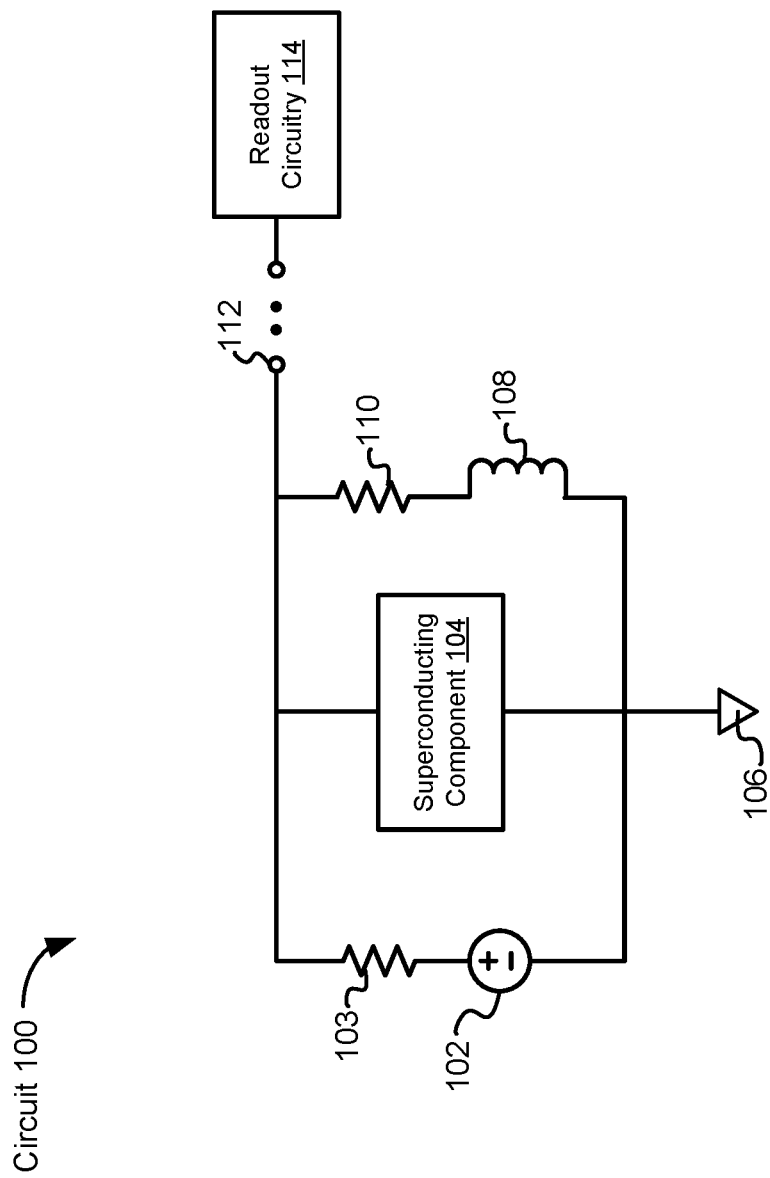
FIGS. 1A-1B are block diagrams illustrating representative superconductor amplification circuits in accordance with some embodiments.
Figure 1B:
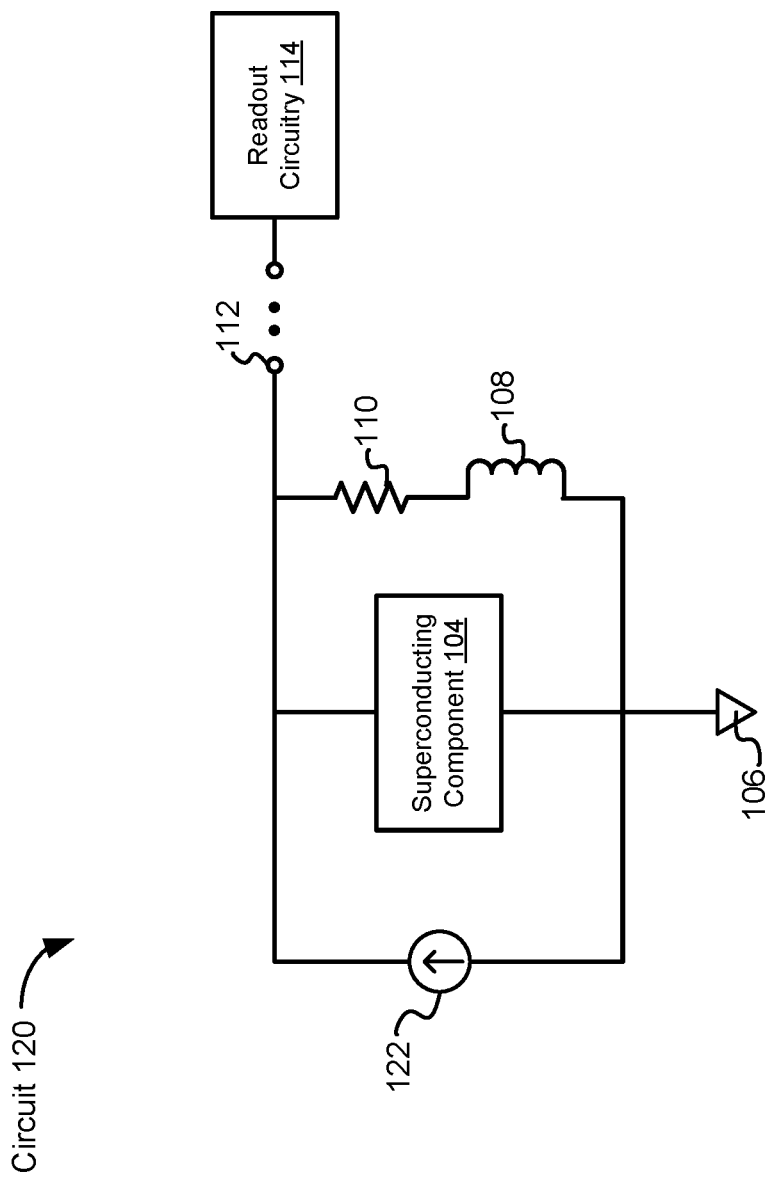

FIGS. 1A-1B are block diagrams illustrating representative superconductor amplification circuits in accordance with some embodiments. FIG. 1A shows a superconductor amplification circuit 100 including a superconducting component 104, a resistor 110, an inductor 108, and a voltage source 102 in series with a resistor 103, in accordance with some embodiments. The amplification circuit 100 is configured so as to have a transimpedance gain (e.g., for a gain in the range of 100 to 10,000) with respect to a bias current for the superconducting component and an output voltage at the output node 112.

In some embodiments, the voltage source 102 is configured to supply a voltage between 100 millivolts (mV) and 5 Volts (V). In some embodiments, the superconducting component 104 comprises one or more superconducting wires.

In some embodiments, the superconducting component 104 is configured to transition from a superconducting state to a non-superconducting state in response to one or more inputs. In some embodiments, the superconducting component 104 comprises a photon detection circuit. For example, the superconducting component is a photon detector configured to transition from the superconducting state to the non-superconducting state in response to one or more incident photons. In various embodiments, the superconducting component 104 comprises a photon detection component (e.g., a superconducting nanowire single-photon detector (SNSPD)) and/or a superconductor readout component. In some embodiments, the superconducting component 104 comprises a pump-gated superconducting photon detector (e.g., as described in U.S. Provisional Patent Application No. 62/507,198, which is incorporated by reference herein in its entirety). In some embodiments, the superconducting component 104 comprises a superconducting logic component (e.g., as described in U.S. Provisional Patent Application No. 62/632,323, which is incorporated by reference herein in its entirety).

In some embodiments, the inductor 108 is configured to increase the voltage at the output node 112 as the superconductor transitions from the superconducting state to the non-superconducting state.

As an example, the superconductor amplification 100 is configured to have a transimpedance gain in the range of 100 to 10,000, e.g., with a bias current through the superconducting component 104 in the range of 5 microamperes (μA) to 100 μA and an output voltage at the output node 112 in the range of 1 millivolt (mV) to 100 mV.

In some embodiments, the inductor 108 has an inductance in the range of 10 nanoHenry (nH) to 100 nH. In some embodiments, the resistor 110 has a resistance in the range of 10 Ohms to 200 Ohms. In some embodiments, the resistor 110 is configured to prevent a latch-up condition from occurring. In some embodiments, not shown, the circuit 100 does not include the resistor 110. The superconductor amplification circuit 100 also includes a reference node 106, and readout circuitry 114 coupled to an output node 112. In some embodiments, the reference node 106 comprises an electrical ground. In various embodiments, the readout circuitry 114 includes a slicer, a comparator, a switch, an analog-to-digital converter (ADC), and/or driver circuitry. In some embodiments, the readout circuitry 114 comprises circuitry configured to determine an output voltage at the output node 112. In some embodiments, the readout circuitry 114 comprises circuitry configured to determine whether an output voltage at the output node 112 meets one or more predetermined criteria (e.g., exceeds a particular voltage threshold). In some embodiments, the circuit 100 includes one or more additional components, not shown, such as additional resistors, capacitors, and the like. In some embodiments, the circuit 100 includes one or more resistors, inductors, or capacitors configured to impedance match the output node 112 with a transmission line or readout circuit (e.g., readout circuitry 114). In some embodiments, the resistor 103 has a resistance between 50 kiloOhms and 500 kiloOhms. In accordance with some embodiments, the inductor 108 allows for inductive peaking on the superconducting component 104. In some embodiments, the readout circuitry 114 is coupled between the resistor 110 and inductor 108.

FIG. 1B shows a superconductor amplification circuit 120 similar to the circuit 100 in FIG. 1A, except that the circuit 120 includes a current source 122 rather than the voltage source 102 in series with the resistor 103, in accordance with some embodiments. The amplification circuit 120 is configured so as to amplify an output voltage of the superconducting component 104 at the output node 112 (e.g., for a gain of 3, 5, or 10). As an example, the superconducting component 104 is configured to output a voltage of 0.7 milliVolts (mV) when triggered and the amplification circuit 120 is configured to output a corresponding 7.0 mV. In some embodiments, the circuit 120 is configured to output a voltage at the node 112 as shown in Equation 1 below:

$$V_{out} \approx ((sL_{Load}+R) \| sL_k) i_{bias} \qquad \text{Equation 1—Output Voltage}$$

where $V_{out}$ is the voltage at the output node 112, R is the resistance of the resistor 110, $sL_{Load}$ is the impedance of the inductor 108 (e.g., $s=j\omega$), and $L_k$ is the kinetic inductance of the superconducting component 104. In some embodiments, the inductor 108 is configured to cause the output voltage to peak in the rise time. In some embodiments, the inductor 108 also causes an increase in fall time at the output. In some embodiments, the impedance of the inductor 108 is such that it is high for the rising edge of the pulse caused by the transition of superconductor component 104 to the non-superconducting state, but becomes small for the fall-time (slow) part of the pulse, and therefore does not latch up the circuit. In some embodiments, the inductor 108 acts as a high pass filter due to the frequency dependency of the impedance of the inductor 108.

In some embodiments, (e.g., in embodiments where $L_{Load} \gg L_k$) the circuit 120 is configured such that the fall time (T) of the bias current is estimated as:

$$T \approx \frac{L_{Load}}{R_{Load}} \qquad \text{Equation 2}$$

Fall Time Estimation where $R_{Load}$ is the resistance of the resistor 110 and $L_{Load}$ is the inductance of the inductor 108. Thus, in accordance with some embodiments, the inductor 108 and/or the resistor 110 are configured to set a desired fall time for the amplification circuit 120.

Figure 2A:
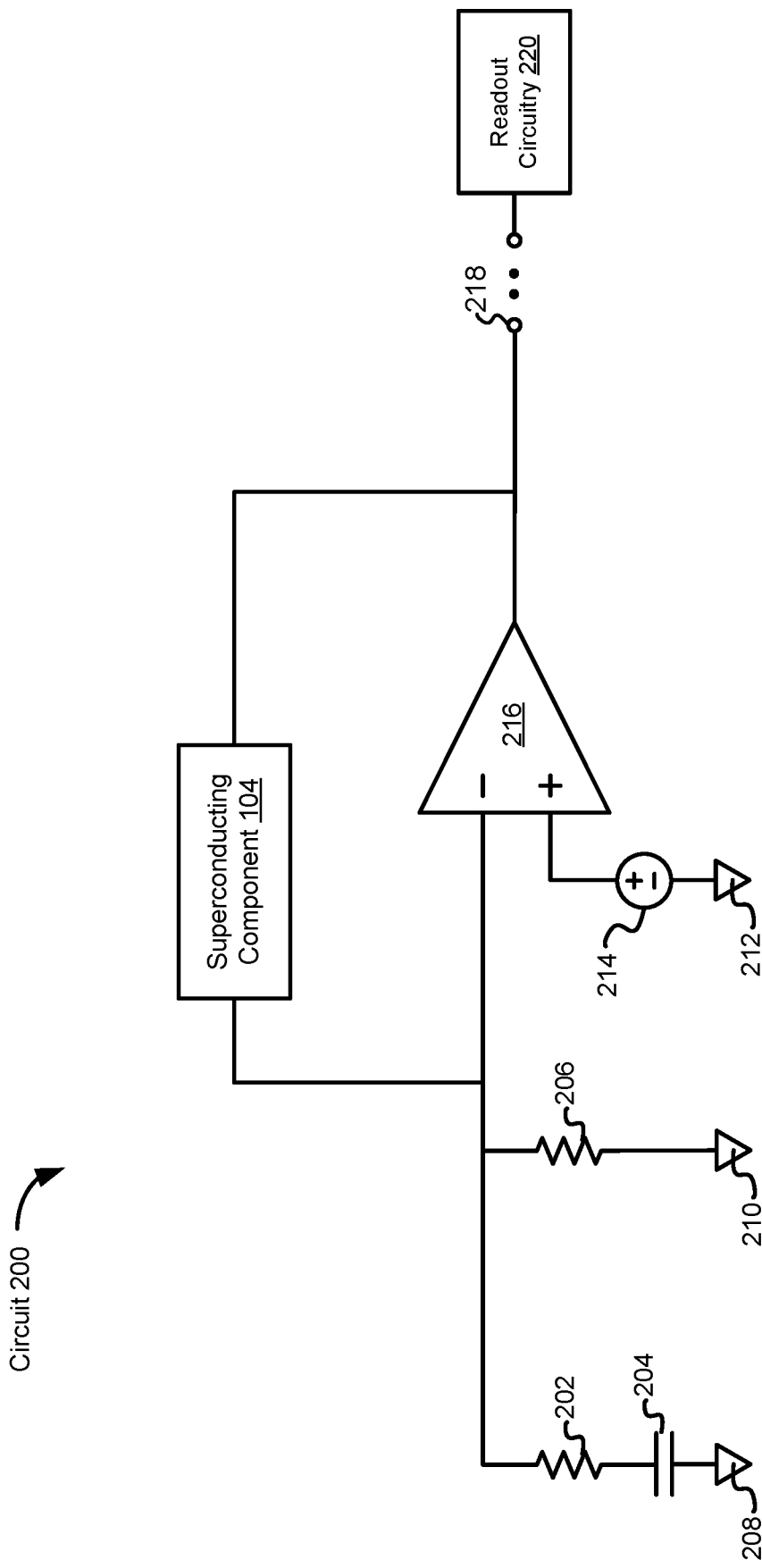
FIGS. 2A-2B are block diagrams illustrating representative superconductor amplification circuits in accordance with some embodiments.
Figure 2B:
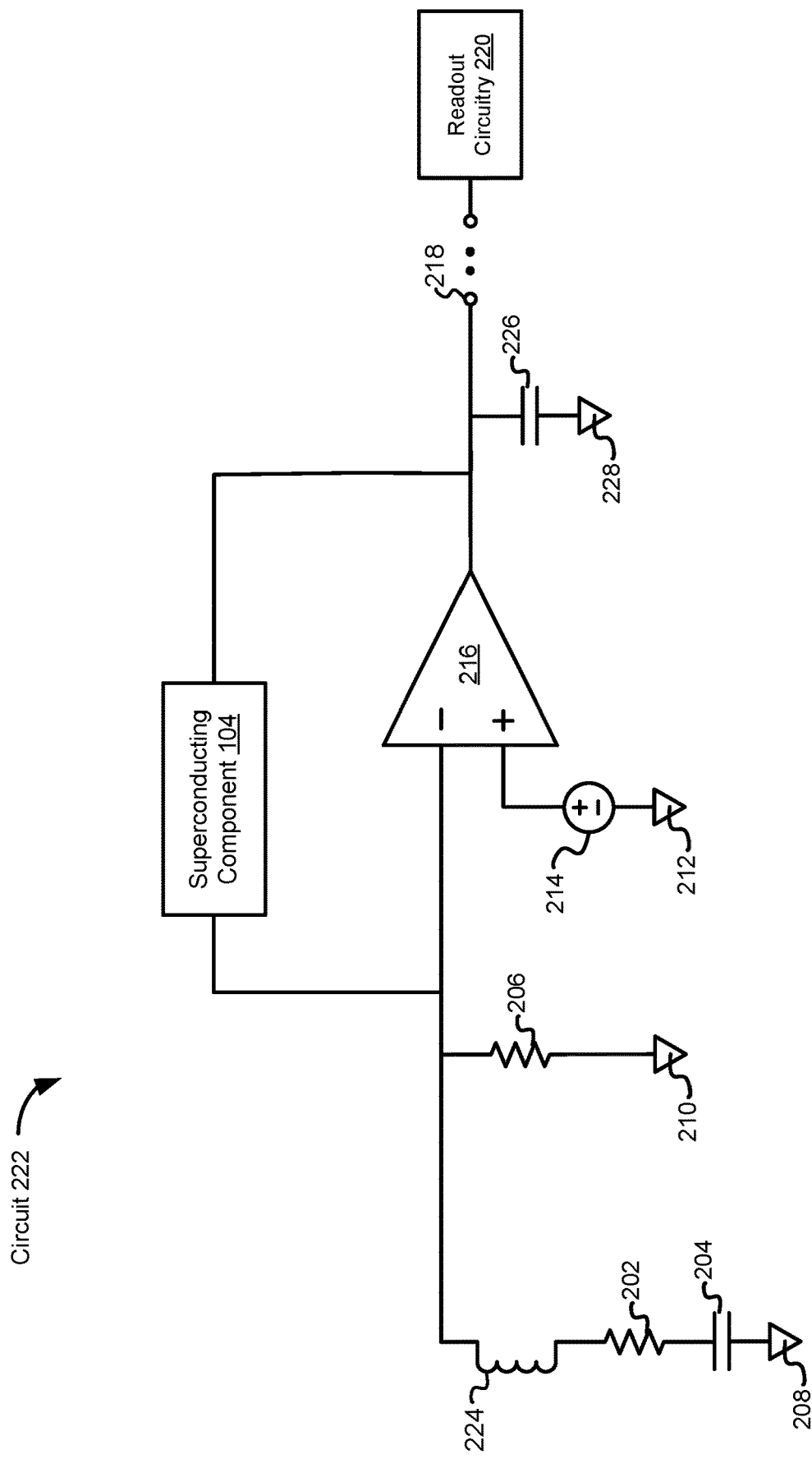

FIGS. 2A-2B are block diagrams illustrating representative superconductor amplification circuits in accordance with some embodiments. FIG. 2A shows a superconductor amplification circuit 200 including an amplifier 216 (e.g., a differential amplifier). In some embodiments, the amplifier 216 is a high impedance amplifier. In some embodiments, the amplifier 216 is configured to have a gain of 10 or more. In some embodiments, the amplifier 216 is configured to have a gain bandwidth in the range of 100 megaHertz (MHz) to 100 gigaHertz (GHz).

FIG. 2A further shows a voltage source 214 and reference node 212 (e.g., an electrical ground) coupled to a first input (+) of the amplifier and resistors 202 and 206, a capacitor 204, and reference nodes 208 and 210 coupled to a second input of the amplifier. In some embodiments, the capacitor 204 is configured to "short" once the superconducting component 104 transitions to the non-superconducting state to enable the superconducting component 104 to transition back to the superconducting state (e.g., enable cooling of the superconducting component 104). In some embodiments, the capacitor 204 has a capacitance in the range of 0.5 nanoFarads (nF) to 100 microFarads (μg). In some embodiments, the resistor 206 has a resistance between 10 kiloOhms (kΩ) and 500 kΩ In some embodiments, resistor 202 has a resistance between 1 Ohm (Ω) and 100Ω. In some embodiments, the voltage source 214 is configured to supply a voltage in the range of 0.5 Volts (V) to 5V.

FIG. 2A also shows a superconducting component 104 coupled between an output of the amplifier 216 and the second input (−) of the amplifier (e.g., in a feedback path of the amplifier 216). The amplification circuit 200 is configured so as to amplify an output voltage of the superconducting component 104 at the output node 218 (e.g., for a gain of 10, 50, or 500). As an example, the superconducting component 104 is configured to output a voltage (i.e., have a resistance that produces a voltage difference across the component's two nodes) of 18 milliVolts (mV) when superconducting component 104 is in the non-superconducting state, and the amplification circuit 200 is configured to output a corresponding 1.1 V on output node 218, representing an amplification factor of approximately 61 in accordance with some embodiments.

In some embodiments, transimpedance amplification of the circuit is defined as the ratio of the voltage at the output node 218 ($V_{out}$) to a bias current of the superconducting component 104 ($I_{super}$). In some embodiments, the amplification is estimated as:

$$V_{out} \approx \frac{V_{ref}}{R_{bias}} *$$
$$((Z_x A) \parallel (R_{sc} + sL_k)) \approx \frac{V_{ref}}{R_{bias}} * ((A*sL_{sig} + A*R_{sig}) \parallel (R_{sc} + sL_k))$$

Equation 3

Amplification where $V_{out}$ is the voltage at the output node 218, $R_{sc}$ is the resistance of the superconducting component 104, s is a constant (e.g., s=jω), A is the gain of the amplifier, $L_k$ is the kinetic inductance of the superconducting component 104, $Z_x$ is the impedance of the second (negative) input to the amplifier, $L_{sig}$ is the inductance of the inductor 224 (FIG. 2B), and $R_{sig}$ is the resistance of the resistor 202. As seen in Equation 3, since the superconducting component 104 has a zero resistance while in the superconducting mode, there is no voltage gain in that mode (e.g., $R_{sc}$ and $sL_k$ are each zero). Further, in embodiments lacking an inductor 224, the value of $L_{sig}$ is zero. Thus, the amplification circuit in FIG. 2B amplifies the inductance of the inductor 224.

In addition, FIG. 2A shows readout circuitry 220 coupled to an output node 218 of the amplifier 216. In some embodiments, the circuit 200 is configured to drive a capacitive load (e.g., represented by the capacitor 226 in FIG. 2B). In some embodiments, the circuit 200 is configured to drive a high impedance load (e.g., the amplifier has a gain greater than 10). In some embodiments, the circuit 200 is configured to drive a transmission line (e.g., a 50Ω transmission line). In accordance with some embodiments, the circuit 200 is able to drive output loads having a wide range of impedances due to a low output impedance of the amplifier 216. In some embodiments, the readout circuitry 220 comprises circuitry configured to determine an amount of output voltage at the output node 218. In some embodiments, the readout circuitry 220 comprises circuitry configured to determine whether an amount of output voltage at the output node 218 meets one or more predefined criteria (e.g., exceeds a predefined voltage threshold).

In some embodiments, the resistor 206 and the voltage source 214 comprise a bias network. In some embodiments, the bias network has a bias current ($i_{bias}$):

$$i_{bias} \approx \frac{V_{reference}}{R_{bias}}$$

Equation 4

Bias Current where $V_{reference}$ is the voltage supplied by the voltage source 214 and $R_{bias}$ is the resistance of the resistor 206. In some embodiments, the voltage source 214 and the resistor 206 are configured so as to supply a bias current (i in the range of 1 microAmperes (μA) to 100 μA. As an example, the voltage source 214 is configured to supply a voltage of 1.2 volts and the resistor 206 is configured to have a resistance of 100 kiloOhms (kΩ).

FIG. 2B shows a superconductor amplification circuit 222 similar to the superconductor amplification circuit 200 of FIG. 2A, except that the superconductor amplification circuit 222 includes optional components, such as an inductor 224, a capacitor 226, and a reference node 228. The amplification circuit 222 is configured so as to amplify an output voltage of the superconducting component 104 at the output node 218 (e.g., for a gain of 10, 50, or 500). In some embodiments, the circuit 222 does not include the resistor 206 or the reference node 210. In some embodiments, the inductor 224 has an inductance in the range of 50 nanoHenry (nH) to 500 nH. In some embodiments, the inductor 224 is configured to inductively peak voltage at the second input (−) of the amplifier 216 in response to a transition of the superconductor component 104 to from the superconducting state to the non-superconducting state. In some embodiments, the inductor 224 has a large impedance for high frequencies (sL), such that for the high frequency part of a pulse (e.g., the rising edge) the output voltage is increased.

In some embodiments, the amplification circuit 222 further includes a capacitor (e.g., capacitor 204) coupled to the second input of the amplifier (e.g., a capacitor with a capacitance between 100 nanoFarad (nF) and 10 microFarad). In some embodiments, the capacitor has a capacitance less than 100 nF. In some embodiments, the capacitor is configured to enable the superconducting component to transition back to the superconducting state from the non-superconducting state.

In some embodiments, the resistor 202 is configured to reduce a time constant ($T_1$) of the inductive peak generated by the inductor 224 (e.g., in accordance with Equation 2 above). In some embodiments, (e.g., embodiments where $L_{sig} \gg L_k$) the time constant is defined by:

$$T_1 = L_{sig}/R_{sig}$$

Equation 5—Time Constant where $L_{sig}$ is the inductance of the inductor 224 and $R_{sig}$ is the resistance of the resistor 202. In some embodiments, $L_{sig}$ and $R_{sig}$ are configured such that the time constant $T_1$ is greater than a thermal cooling time of the superconducting component 104. In accordance with some embodiments, the thermal cooling time of the superconducting component 104 is a time required for the superconductor to transition from the non-superconducting state to the superconducting state after a transitioning stimulus is applied. For example, the superconducting component 104 transitions from the superconducting state to the non-superconducting state in response to an incident photon at a first time $T_0$. In this example, the superconducting component 104 transitions back to the superconducting state before a second time equal to $T_0$ plus $T_1$. Thus, circuit 222 prepares to be triggered in response to a next triggering event while superconducting component transitions back to the superconducting state.

In some embodiments, the combined impedance ($Z_{sig}$) of the inductor 224, resistor 202, and capacitor 204 is equivalent to $Z_x$, described above. In some embodiments, the combined impedance $Z_{sig}$ is configured such that:

$$Z_{sig} < ((R_{superconductor}/A) \| R_{bias})$$ Equation 6—Impedance Constraint where $R_{superconductor}$ is a resistance of the superconducting component 104 when the component 104 is in the non-superconducting state, A is the gain of the amplifier 104, and $R_{bias}$ is the resistance of the resistor 206. In some embodiments, the amplifier bandwidth is equal to, or greater than, two times the frequency range of the amplifier over which the gain of the amplifier is attenuated from a peak gain by no more than three decibels ($f_{3dB}$), sometimes called the three decibel bandwidth. In some embodiments, circuit is configured such that the $f_{3dB} \gg 1/T_1$ (where $T_1$ is greater than the thermal cooling time of the superconductor component), e.g., the $f_{3dB}$ is equal to $2/T_1$. Thus, for example, when $T_1 = 33$ nanoseconds (ns) the amplifier's $f_{3dB}$ is approximately 60 megaHertz (MHz).

Although FIGS. 1A-1B and 2A-2B show amplification circuits with superconducting component 104, in some embodiments, the superconducting component 104 is replaced with a non-superconducting component having a non-linear resistance (e.g., a semiconducting component transitioning between a normal state and a freeze-out state). In some embodiments, the superconducting component 104 is replaced with a transistor, such as those described in U.S. Provisional Application No. 62/591,600, filed Nov. 28, 2017, entitled "Nanowire Transistor," which is hereby incorporated by reference in its entirety.

FIG. 3 is a prophetic diagram illustrating voltage output of a superconductor amplification circuit (e.g., the circuit 100, 120, 200, or 222) in accordance with some embodiments. As shown in FIG. 3, an increase in a bias current 302 to an $I_{super}$ value, which corresponds to the superconducting component transitioning from the superconducting state to the non-superconducting state, generates a corresponding spike in an output voltage 304 to a $V_{out}$ value, sometimes herein called the peak output voltage. In accordance with some embodiments, the output voltage 304 for the amplification circuit (e.g., the circuit 100, 120, 200, or 222) has a current fall time of $T_{fall}$ (e.g., given by Equation 2 or 5 above). The ratio of $V_{out}$ to $I_{super}$ represents a transimpedance gain of the amplification circuit. As described above with reference to FIGS. 1A-1B and 2A-2B, the amplification ranges from 100 to 10,000 volts per amp in various embodiments.

In light of these principles and embodiments, we now turn to certain additional embodiments.

In accordance with some embodiments, an amplification circuit includes: (1) a superconducting component (e.g., superconducting component 104 in FIG. 2A); (2) an amplifier (e.g., amplifier 216) coupled in parallel with the superconducting component (e.g., the superconducting component 104) such that the superconducting component is in a feedback loop of the amplifier; (3) a voltage source (e.g., voltage source 214) coupled to a first input of the amplifier (e.g., a positive input); (4) one or more resistors (e.g., resistors 206 and 202) coupled to a second input of the amplifier (e.g., a negative input); and (5) an output terminal (e.g., output terminal 218) coupled to an output of the amplifier.

In some embodiments, the superconducting component is configured to transition from a superconducting state to a non-superconducting state in response to one or more inputs. In some embodiments, the superconducting component comprises a photon detector component. For example, the superconducting component is a photon detector configured to transition from the superconducting state to the non-superconducting state in response to one or more incident photons. In some embodiments, the superconducting component comprises a superconducting transistor, FPGA, or other component.

In some embodiments, the amplification circuit is configured to amplify a current of the superconducting component (e.g., a bias current) when the superconducting component transitions from the superconducting state to the non-superconducting state (e.g., as illustrated in FIG. 3). In some embodiments, the superconducting component is configured to have a bias current between 1 μA and 100 μA and the amplification circuit is configured to have an output voltage between 1 millivolt (mV) and 500 mV.

In some embodiments, the amplifier comprises a differential amplifier (e.g., with a low output impedance). In some embodiments, the amplifier comprises an operational amplifier (OpAmp). In some embodiments, the amplifier is configured to have a gain greater than 10. In some embodiments, the amplifier is configured to have a gain bandwidth in the range of 100 MHz to 100 GHz.

In some embodiments, the amplification circuit further includes a capacitor (e.g., capacitor 204) coupled to the second input of the amplifier (e.g., a capacitor with a capacitance between 100 nanoFarad (nF) and 10 microFarad). An example is shown in FIG. 2B. In some embodiments, the capacitor has a capacitance less than 100 nF. In some embodiments, the capacitor is configured to enable the superconducting component to transition back to the superconducting state from the non-superconducting state.

In some embodiments, the one or more resistors comprise two resistors coupled in parallel with one another (e.g., resistors 202 and 206). In some embodiments, the one or more resistors comprise two resistors coupled in series with one another. In some embodiments, the one or more resistors comprise a first resistor (e.g., resistor 206) and a second resistor (e.g., resistor 202), the second resistor having a resistance less than ten percent of the first resistor. In some embodiments, one example being shown in FIG. 2B, the first resistor (e.g., resistor 206) is connected between the second input of the amplifier and a reference node (e.g., a constant-voltage voltage source), and the second resistor and a capacitor are connected in series between the second input of the amplifier and the reference node (e.g., reference node 208). In some embodiments, the first resistor is connected to an input of the amplifier, and the second resistor, a capacitor (e.g., capacitor 204), and, optionally, an inductor, are connected in parallel with the first resistor. In some embodiments, the first resistor and a voltage source comprise a bias network configured to bias the superconducting component (e.g., the superconducting component 104).

As used herein, a "superconducting component" or "superconductor component" is a component (e.g., circuitry) having one or more superconducting materials. For example, a superconductor amplifier circuit is an amplifier circuit that includes one or more superconducting materials. As used herein, a "superconducting" material is a material that is capable of operating in a superconducting state (under particular conditions). For example, a superconducting material is a material that operates as a superconductor (e.g., operates with zero electrical resistance) when cooled below a particular temperature (e.g., a threshold temperature) and having less than a threshold current flowing through it. A superconducting material is also called herein a superconduction-capable material. In some embodiments, the superconducting materials operate in an "off" state where little or no current is present. In some embodiments, the superconducting materials operate in a non-superconducting state during which the materials have a non-zero electrical resistance (e.g., a resistance in the range of one thousand to ten thousand ohms). For example, a superconducting material supplied with a current greater than a threshold superconducting current for the superconducting material transitions from a superconducting state having zero electrical resistance to a non-superconducting state having non-zero electrical resistance. As an example, superconducting component 104 is a component that is capable of operating in a superconducting state (e.g., under particular operating conditions).

As used herein, a "wire" is a section of material configured for transferring electrical current. In some embodiments, a wire includes a section of material conditionally capable of transferring electrical current (e.g., a wire made of a superconducting material that is capable of transferring electrical current while the wire is maintained at a temperature below a threshold temperature). A cross-section of a wire (e.g., a cross-section that is perpendicular to a length of the wire) optionally has a geometric (e.g., flat or round) shape or a non-geometric shape. In some embodiments, a length of a wire is greater than a width or a thickness of the wire (e.g., the length of a wire is at least 5, 6, 7, 8, 9, or 10 times greater than the width and the thickness of the wire).

It will also be understood that, although the terms first, second, etc. are, in some instances, used herein to describe various elements, these elements should not be limited by these terms. These terms are only used to distinguish one element from another. For example, a first current could be termed a second current, and, similarly, a second current could be termed a first current, without departing from the scope of the various described embodiments. The first current and the second current are both currents, but they are not the same condition unless explicitly stated as such.

The terminology used in the description of the various described embodiments herein is for the purpose of describing particular embodiments only and is not intended to be limiting. As used in the description of the various described embodiments and the appended claims, the singular forms "a", "an" and "the" are intended to include the plural forms as well, unless the context clearly indicates otherwise. It will also be understood that the term "and/or" as used herein refers to and encompasses any and all possible combinations of one or more of the associated listed items. It will be further understood that the terms "includes," "including," "comprises," and/or "comprising," when used in this specification, specify the presence of stated features, integers, steps, operations, elements, and/or components, but do not preclude the presence or addition of one or more other features, integers, steps, operations, elements, components, and/or groups thereof.

The foregoing description, for purpose of explanation, has been described with reference to specific embodiments. However, the illustrative discussions above are not intended to be exhaustive or to limit the scope of the claims to the precise forms disclosed. Many modifications and variations are possible in view of the above teachings. The embodiments were chosen in order to best explain the principles underlying the claims and their practical applications, to thereby enable others skilled in the art to best use the embodiments with various modifications as are suited to the particular uses contemplated.

What is claimed is:

1. An amplification circuit, comprising:
    a superconducting component;
    an amplifier coupled in parallel with the superconducting component;
    a voltage source coupled to a first input of the amplifier;
    one or more resistors coupled to a second input of the amplifier; and
    an output terminal coupled to an output of the amplifier, a voltage at the output terminal being proportional to a ratio of a resistance of the superconducting component to another resistance of the one or more resistors that are coupled to the second input of the superconducting component.

2. The amplification circuit of claim 1, wherein the superconducting component is configured to transition from a superconducting state to a non-superconducting state in response to one or more inputs.

3. The amplification circuit of claim 2, wherein the amplification circuit is configured to amplify a bias current of the superconducting component when the superconducting component is in the non-superconducting state.

4. The amplification circuit of claim 1, wherein the amplifier comprises a differential amplifier.

5. The amplification circuit of claim 1, wherein the amplifier comprises an operational amplifier (OpAmp).

6. The amplification circuit of claim 1, further comprising a capacitor coupled to the second input of the amplifier.

7. The amplification circuit of claim 1, wherein the one or more resistors comprise two resistors coupled in parallel with one another.

8. The amplification circuit of claim 1, wherein the one or more resistors comprise a first resistor R1 and a second resistor R2, the second resistor R2 having a resistance less than ten percent of the first resistor R1.

9. The amplification circuit of claim 8, wherein the first resistor R1 is connected between the second input of the amplifier and a reference node, and the second resistor R2 and a capacitor are connected in series between the second input of the amplifier and the reference node.

10. The amplification circuit of claim 1, wherein the amplification circuit further comprises a readout circuit coupled to the output to readout the voltage.

11. A method comprising:
    providing a first voltage to an amplifier of an amplification circuit, the amplifier comprising a first input, a second input, and an output, the first voltage being provided to the first input of the amplifier, the amplification circuit comprising one or more resistors that are coupled to the second input of the amplifier, the amplification circuit further comprising a superconducting component that is coupled in parallel with the amplifier;
    transitioning the superconducting component from a superconducting state to a non-superconducting state; and
    outputting a second voltage from the output of the amplifier in response to the superconducting component transitioning to the non-superconducting state, the second voltage being proportional to a ratio of a resistance of the superconducting component and another resistance of the one or more resistors that are coupled to the second input of the superconducting component.

12. The method of claim 11, wherein the superconducting component is transitioned from the superconducting state to the non-superconducting state in response to one or more inputs.

13. The method of claim 12, wherein the amplification circuit amplifies a bias current of the superconducting component when the superconducting component is in the non-superconducting state.

14. The method of claim 11, wherein the amplifier comprises a differential amplifier.

15. The method of claim 11, wherein the amplifier comprises an operational amplifier (OpAmp).

16. The method of claim 11, further comprising a capacitor coupled to the second input of the amplifier.

17. The method of claim 11, wherein the one or more resistors comprise two resistors coupled in parallel with one another.

18. The method of claim 11, wherein the one or more resistors comprise a first resistor R1 and a second resistor R2, the second resistor R2 having a resistance less than ten percent of the first resistor R1.

19. The method of claim 18, wherein the first resistor R1 is connected between the second input of the amplifier and a reference node, and the second resistor R2 and a capacitor are connected in series between the second input of the amplifier and the reference node.

20. The method of claim 11, wherein the amplification circuit further comprises a readout circuit coupled to the output of the amplifier to readout the second voltage.

\* \* \* \* \*